(12) United States Patent
Choi et al.

(10) Patent No.: US 6,322,713 B1
(45) Date of Patent: Nov. 27, 2001

(54) NANOSCALE CONDUCTIVE CONNECTORS AND METHOD FOR MAKING SAME

(75) Inventors: Kyung Moon Choi, Scotch Plains; Sungho Jin, Millington, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/354,928

(22) Filed: Jul. 15, 1999

(51) Int. Cl.[7] ..................................................... B82B 1/00
(52) U.S. Cl. ......................... 216/38; 423/447.3; 423/460; 423/445 B
(58) Field of Search ..................... 216/38, 83; 117/129, 117/915; 445/26, 46, 49; 423/447.3, 460, 445 B

(56) References Cited

U.S. PATENT DOCUMENTS

| | | | |
|---|---|---|---|
| 5,346,683 | * | 9/1994 | Green et al. ........................ 428/447.2 |
| 5,457,343 | * | 10/1995 | Ajayan et al. ........................ 257/734 |
| 5,482,601 | * | 1/1996 | Ohshima et al. ..................... 204/173 |
| 5,753,088 | * | 5/1998 | Olk ........................................ 204/173 |
| 5,773,834 | * | 6/1998 | Yamamoto et al. .................. 250/423 |
| 5,805,426 | * | 9/1998 | Merritt et al. ........................ 361/769 |
| 5,922,214 | * | 7/1999 | Liu et al. ................................ 216/2 |
| 6,001,500 | * | 10/1999 | Bass et al. ............................. 429/31 |
| 6,004,444 | * | 12/1999 | Aksay et al. .......................... 204/515 |
| 6,020,677 | * | 2/2000 | Blanchet-Fincher et al. ........ 313/336 |
| 6,146,227 | * | 11/2000 | Mancevski .............................. 445/24 |

FOREIGN PATENT DOCUMENTS

0758028-A2  *  12/1997  (EP)  .............................. D01F/9/127

OTHER PUBLICATIONS

Endo et al., "Pyrolytic Carbon Nanotubes from VaporGrown carbon Fibers", Carbon, vol. 33, No. 7, pp. 873–881 (1995).*

Li et al., "Large–Scale Synthesis of Aligned Carbon Nanotubes", Science, vol. 274, Dec. 6, 1996, pp. 1701–1703.*

Ebbesen et al., "Large–Scale Synthesis of Carbon Nanotubes", Nature, vol. 358, Jul. 16, 1992, pp. 220–221.*

Kyotani et al., "Preparation of Ultrafine Carbon Tubes in Nanochannels of an Anodic Aluminum Oxide Film", Chem. Mater., vol. 8, No. 8, 1996, pp. 2109–2113.*

Lin et al., "Large Scale Synthesis of Single–Shell carbon Nanotubes", Appl. Phys. Lett., vol. 64, No. 2, Jan. 10, 1994, pp. 181–183.*

Dai et al., "Single–Wall Nanotubes Produced by MetalCatalyzed Disproportionation of Carbon Monoxide", Chemical Physics Letters, vol. 260, Sep. 27, 1996, pp. 471–475.*

Baker et al., "Catalytic Growth of Carbon Nanofibers and Nanotubes", Mat. Res. Soc. Symp. Proc., vol. 349, pp. 251–256 (1994).*

Endo et al., "Formation of Carbon Nanofibers", J. Phys. Chem., vol. 96, No. 17, pp. 6941–6944 (1992).*

Hatta et al., "Very Long Graphitic Nano–Tubules synthesized by Plasma–Decomposition of Benzene", Chemical Physics Letters, vol. 217, No. 4, Jan. 21, 1994, pp. 398–402.*

* cited by examiner

*Primary Examiner*—Randy Gulakowski
*Assistant Examiner*—Jiri Smetana
(74) *Attorney, Agent, or Firm*—Lowenstein Sandler PC

(57) ABSTRACT

In accordance with the invention, nanoscale connectors particularly useful for connecting microscale devices comprise free-standing nanoscale conductors. The nanoscale conductors are conveniently fabricated in sets of controlled, preferably equal length by providing a removable substrate, growing conductive nanotubes or nanowires on the substrate, equalizing the length of the nanoscale conductors, and removing the substrate. Preferably the removable substrate is soluble, leaving a collection of free standing nanoscale connectors in suspension or solution.

8 Claims, 4 Drawing Sheets

NANOSCALE CONDUCTIVE CONNECTORS AND METHOD FOR MAKING SAME

FIELD OF THE INVENTION

This invention relates to conductive connecting elements and, in particular, to nanoscale connectors for microdevices such as integrated circuit components and to methods for making such connectors.

BACKGROUND OF THE INVENTION

As integrated circuits become smaller, structures for electrically connecting microscopic electronic devices become increasingly important. Integrated circuits can now be made with hundreds of thousands of devices of submicron dimension requiring at least as many conductive interconnections among the devices and hundreds of interconnections with packaging leads. As the circuits become smaller and more complex, the difficulties of making sufficiently small, uniform metal wires and metal stripes become increasingly a limitation on circuit design and performance. The standard gold wires used to bond IC pads to package leads are relatively bulky, limiting the minimum size of IC bonding pads, and the metal stripes used to interconnect microdevices within an IC are subject to cross sectional nonuniformities. Accordingly there is a need for nanoscale connectors which provide high, uniform conduction.

SUMMARY OF THE INVENTION

In accordance with the invention, nanoscale connectors particularly useful for connecting microscale devices comprise free-standing nanoscale conductors. The nanoscale conductors are conveniently fabricated in sets of controlled, preferably equal length by providing a removable substrate, growing conductive nanotubes or nanowires on the substrate, equalizing the length of the nanoscale conductors, and removing the substrate. Preferably the removable substrate is soluble, leaving a collection of free standing nanoscale connectors in suspension or solution.

BRIEF DESCRIPTION OF THE DRAWINGS

The nature, advantages and various additional features of the invention will appear more fully upon consideration of the illustrative embodiments now to be described in detail with the accompanying drawings. In the drawings.

Figure 1A:
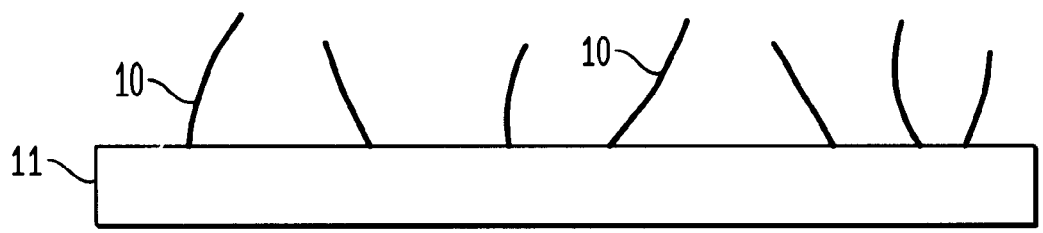
FIGS. 1(a)–(c) schematically illustrates various configuration of nanoscale conductors grown on a substrate.

It is to be understood that the drawings are for purposes of illustrating the concepts of the invention and are not to scale.

DETAILED DESCRIPTION

This description is divided into three parts. Part I describes the conventional growth of substrate-supported nanoscale conductors. Part II describes the fabrication of free-standing nanoscale conductive connectors; and Part III describes the use of nanoscale conductive connectors.

I. Nanoscale Conductors and Their Conventional Growth

To understand the invention, it is useful to understand some of the properties of nanoscale conductors ("nanoconductors") and how they are conventionally grown. Nanoconductors are tiny conductive tubes (hollow) or wires (solid) with a very small size scale of the order of 1.0–100 nanometers in diameter and 0.5–10 $\mu$m in length. Carbon nanotubes are representative. Their structure and fabrication are reported in J. Liu et al., *Science*, Vol. 280, p. 1253 (1998); Z. F. Ren et al., *Science*, Vol. 282, p. 1105 (1998); W. Z. Li, et al., *Science*, Vol. 274, p. 1701 (1996); S. Frank et al., *Science*, Vol. 280, p. 1744 (1998); S. J. Tans et al., *Nature*, Vol. 36, p. 474 (1997); S. Fan, et al., *Science*, Vol. 283, p. 512 (1999); P. G. Collins et al., *Science*, Vol. 278, p. 100 (1997); J. Kong et al., *Nature*, Vol. 395, p. 878 (1998); and T. W. Ebbesen et al., *Nature*, Vol. 382, p. 54 (1996), all of which are incorporated herein by reference. The synthesis of conductive nanowires based on semiconductor materials such as Si or Ge has also been reported. See, for example, A. M. Morales et al., *Science*, Vol. 279, p. 208 (1998) which is incorporated herein by reference.

Carbon nanotubes exhibit unique atomic arrangements, having useful physical properties such as one-dimensional electrical behavior, quantum conductance, and ballistic electron transport. The ballistic transport in carbon nanotubes, as reported by Frank et al, permits the passage of huge electrical currents, with the magnitude of current density comparable to or better than those in superconductors. Carbon nanotubes are among the smallest dimensioned nanotubes materials with generally high aspect ratio and small diameter of about ~1.0 nm in the case of single-wall nanotubes and less than ~50 nm in the case of multi-wall nanotubes. See A. G. Rinzler et al, *Applied Physics*, Vol. A67, p. 29 (1998); Kiang et al, *J. Physical Chemistry*, Vol. 98, p. 6612, (1994); and Kiang et al, *Physical Review Letters*, Vol. 81, p. 1869 (1998), which are incorporated herein by reference.

High-quality single-walled carbon nanotubes are typically grown as randomly oriented, needle-like or spaghetti-like, tangled tubules. They can be grown by chemical vapor deposition (CVD), laser ablation or electric arc growth. CVD methods such as used by Ren et al., Fan et al., and Li et al can produce multiwall nanotubes attached onto a substrate, often with aligned, parallel growth perpendicular to the substrate. Carbon nanotubes are grown on a substrate by catalytic decomposition of hydrocarbon-containing precursors such as ethylene, methane, or benzene. Nucleation layers, such as thin coatings of Ni, Co, or Fe, are often intentionally added onto the substrate surface in order to nucleate a multiplicity of isolated nanotubes. Carbon nanotubes can also be nucleated and grown on a substrate without a metal nucleating layer, by using a precursor including one or more of these metal atoms. During CVD the metal atoms serve to nucleate the nanotubes on the substrate surface. See H. M. Cheng et al., *Chem. Physics Letters*, Vol. 289, p. 602 (1998), which is incorporated herein by reference. Semiconductor nanowires are grown on substrates by similar processes.

Figure 1B:
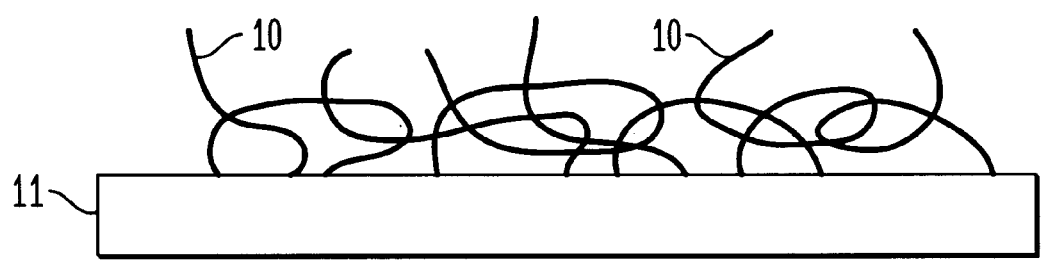
Figure 1C:

Referring to the drawings, FIGS. 1(a)–(c) schematically illustrate various configurations of nanoconductors conductors 10 grown on a substrate 11. The nanoconductors 10 can be carbon nanotubes or Si or GaAs nanowires, synthesize by any one of a variety of methods. In the absence of alignment processing the nanoconductors tend to grow with the random orientation morphology shown in FIG. 1(a) or with the tangled growth morphology shown in FIG. 1(b). Such a tangled morphology of nanoconductors is also obtained in laser ablation synthesis. By using CVD growth in the presence of an applied electric field, a vapor concentration gradient, a temperature gradient, or recessed pores containing catalysts in the substrate, the nanoconductors can be grown with an aligned morphology substantially perpendicular to the substrate. Such aligned nanoconductors 10 are schematically illustrated in FIG. 1(c).

II. Fabrication of Free-Standing Nanoconductors

Nanoscale conductive connectors for connecting microdevices ("nanoconnectors") should be free-standing and preferably of equal length. For reliable circuit interconnections such connectors should be prepared as a collection of free-standing nanoconductors so that they can be placed and bonded for circuit interconnections. They should be of approximately equal length to avoid unwanted short circuits from connectors that are too long and unwanted open circuits from connectors that are too short.

Figure 2:
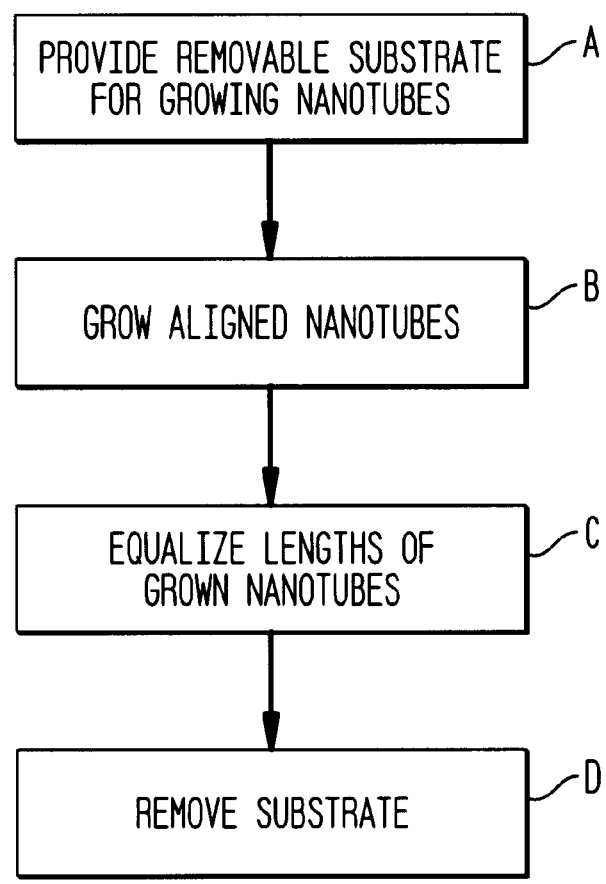
FIG. 2 schematically illustrates an exemplary process of preparing equal length, free-standing nanoscale conductors.

Referring to the drawings, FIG. 2 is a schematic flow diagram of the steps involved in making a collection of free-standing nanoconnectors of controlled, substantially equal length. The first step, shown in block A of FIG. 2, is to provide a removable substrate for nanoconductor growth. Preferably the substrate is removable by dissolving in water or another solvent. The substrate can be a sodium chloride crystal or another water-soluble material. Acid-dissolvable metals such Cu, Ni, Co, Mo, Fe, V, Au, Ag, and their alloys, or base-dissolvable metals such as Al may also be used. Or the substrate can be made of a soluable polymer such as polyvinyl alcohol, polyvinyl acetate, polyacrylamide, acrylonitrile-butadiene-styrene. The removable substrate, alternatively, can be a volatile (evaporable) material such as PMMA polymer.

The removable substrate can be a layered combination of metals or compounds. For example, a solvent-soluble material such as polyacrylamide or an acid-soluable metal such as Cu can be coated with a thin film of nucleating material for nanoconductor growth and used as a substrate during CVD growth. The coating can be a catalyst metal such as Ni, Fe or Co, and can be deposited as a continuous, spotly or patterned film by sputtering, vacuum evaporation or electrochemical deposition.

The next step shown in Block B is to grow aligned nanoconductors on the removable substrate. For example, aligned carbon nanotubes can be grown using CVD growth in the direction of an applied electric field, vapor concentration gradient, temperature gradient, or recessed pores in the substrate to produce aligned nanotubes as discussed in Ren et al., Fan et al. and Li et al. Aligned nanoconductors 10 on a substrate 11 are schematically illustrated in FIG. 1(c). Advantageously the average deviation from vertical growth is less than 25 degrees and preferably less than 15 degrees.

Figure 3:
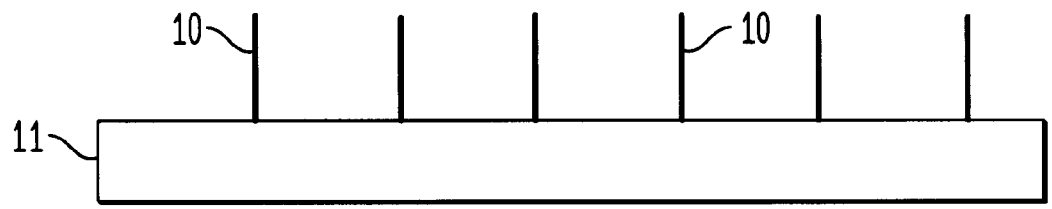
FIG. 3 illustrates aligned nanoscale conductors grown on a removable substrate.

The third step (Block C of FIG. 2) is to equalize the lengths of the grown nanoconductors. Ideally, length equality is achieved by careful growth, but equal length growth is difficult to achieve in practice. FIG. 3 schematically illustrates equal length, aligned nanoconductors 10 on a removable substrate 11.

Figure 4:
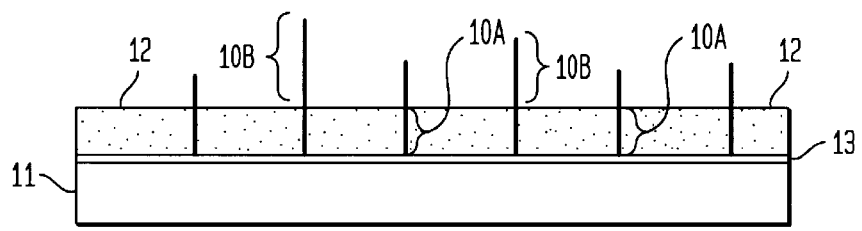
FIGS. 4 and 5 illustrate an exemplary process of equalizing the length of nanoscale connectors.

For aligned nanoconductors grown on a substrate with non-uniform lengths, the third step of FIG. 2 (length-equalization) can be effected by adding to the substrate a sacrificial layer of uniform thickness which will bury the nanoconductors to an equal height level while leaving exposed the nanoconductor material beyond the desired length. This is illustrated in FIG. 4 which shows the nanoconductors 10 partially buried by the sacrificial layer 12. Such a sacrificial locking layer 12 temporarily protects the buried nanoconductor regions 10A while the exposed extra length regions 10B are removed.

The sacrificial layer 12 is desirably a material that can be relatively easily removed after the length equalization, i.e., by dissolving in water or in a solvent, by chemically or electrochemically etching, or by vaporizing through heating. Exemplary sacrificial layer materials include water-soluble or solvent-soluble salts such as sodium chloride, silver chloride, potassium nitrate, copper sulfate, and indium chloride, or soluble organic materials such as sugar and glucose. The sacrificial layer material can also be a chemically etchable metal or alloy such as Cu, Ni, Fe, Co, Mo, V, Al, Zn, In, Ag, Cu—Ni alloy, Ni—Fe alloy and others. These materials can be dissolved in an acid such as hydrochloric acid, aqua regia, or nitric acid, or can be dissolved away in a base solution such as sodium hydroxide or ammonia. The sacrificial layer 12 may also be a vaporizable material such as Zn which can be decomposed or burned away by heat.

The sacrificial layer 12 can be added by chemical deposition such as electroplating or electroless plating, by physical vapor deposition such as sputtering, evaporation, laser ablation, ion beam deposition, or by chemical vapor decomposition. An advantageous method is to electroplate in an electrolyte containing the ions of a metal to be deposited, e.g., Ni from a $NiSO_4$ solution or Cu from a $CuSO_4$-containing solution. The substrate 11 desirably has a catalyst metal coating 13 such as Ni, Co, or Fe. The electrodeposition of the metal preferentially occurs on the catalyst metal coating rather than on the nanoconductors because of chemical affinity. As is well known, the thickness of the electroplated metal is controlled by the processing variables such as the time, temperature, electrolyte concentration, and current density. The thickness of the uniformly deposited sacrificial layer 12 determines the nanoconductor length. For interconnection applications, the desired average length (region 10A) is typically in the range of 10–10,000 nm. Preferably the lengths of at least 90% of the nanoconductors should not deviate more than 20% from the average length.

Figure 5:
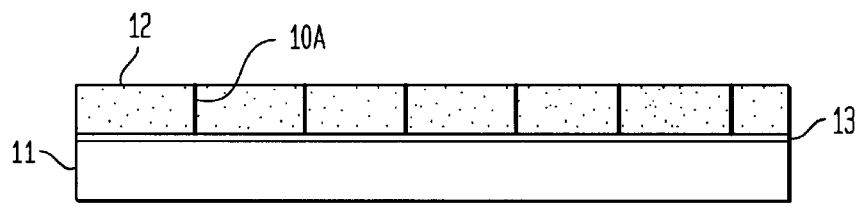

In the next step of the equalization process, the exposed portions 10B of the nanotubes are removed. In the case of carbon nanotubes, the exposed portion can be burned away by heating in an oxidizing atmosphere at temperatures in the range of 200–1000° C. for 0.1–10,000 minutes. The exposed portion 10B can also be removed by mechanical polishing or chemical etching so that only their buried, equal-length part 10A remains. FIG. 5 schematically illustrates the workpiece after removal of the exposed portions.

The third step of FIG. 2 (length eqaulization) may also be achieved by alternative methods without employing a sacrificial layer. For example, equalization can be achieved by laser cutting or hot blade cutting, as disclosed in U.S. patent application Ser. No. 09/236,933 filed by S. Jin on Jan. 25, 1999 and entitled "Article Comprising Aligned Truncated Carbon Nanotubes" now allowed, which is incorporated herein by reference.

Figure 6:
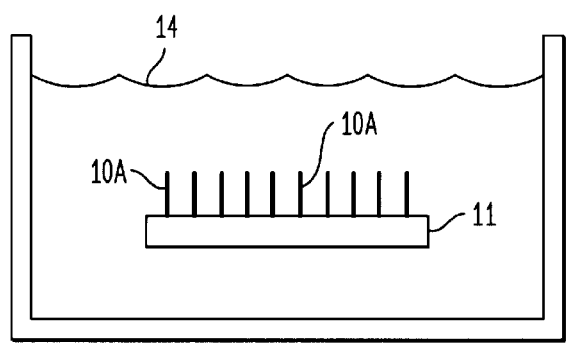
FIG. 6 shows apparatus for removal of the substrate.

The next step in the process of FIG. 2 (Block D) is to remove the substrate. This includes removing any sacrificial layers used in the length equalization process and any catalyst metal film added for nanoconductor nucleation. Removal is advantageously obtained by dissolving the substrate materials, and the particular solvent used depends on the materials. As shown in FIG. 6, the workpiece comprising the substrate 11 and the equal height nanoconductors 10A is typically placed in a bath of solvent 14. The result of this step is a collection of free-standing, equal length nanoconductors. They typically have diameters averaging less than 100 nm, and the lengths of at least 90% of the nanoconductors in the collection do not deviate by more than 20 percent from the average length.

Figure 7:
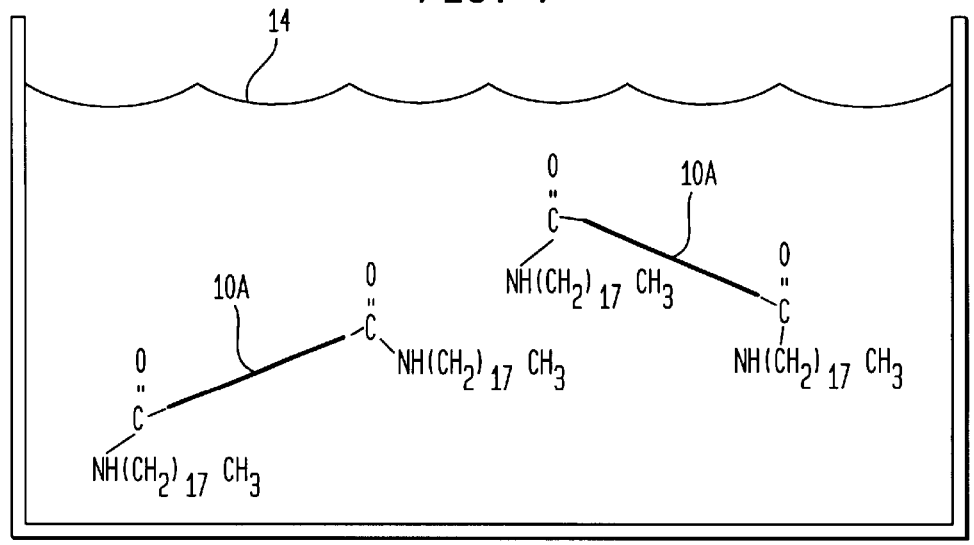
FIG. 7 shows an example of functionalized, equal length, free-standing nanoscale connectors.

The free-standing, equal-length nanoconductors obtained by the process of FIG. 2 are advantageously dispersed in liquid or functionalized and dissolved in liquid so that the collection remains separated without agglomeration. Carbon nanotubes allow various chemical modifications of their open ends, outside walls, or the tube-interior cavity by functionalization chemistry. For example, single-wall carbon nanotubes can be made soluable in common organic solvents such as chloroform, dichloromethane, toluene, $CS_2$, chlorobenzene, etc. by attaching long-chain molecules such as octadecylamin, $NH(CH_2)_{17}CH_3$, to the open ends of the nanotubes. This can be accomplished via formation of amide functionality. FIG. 7 illustrates carbon nanotubes 10A modified for solution.

Other types of functionalization can induce modification of the electronic bandgap structure (and hence the electrical properties) of the nanoconductors, for example, by dichlorocarbene covalent bonding onto nanotube walls. See J. Chen et al., *Science*, Vol. 282, p.95, (1998); J. Chen et al., *Journal of Materials Research*, Vol. 13, p. 2423 (1998); and J. Liu et al., *Science*, Vol. 280, p. 1253 (1998), which are incorporated herein by reference.

III. Nanoscale Connection

The free-standing, equal-length dispersed nanoconductors can be applied to an electronic circuit and for interconnection and bonding. We will refer to such connectors as nanoconnectors.

Figure 8A:
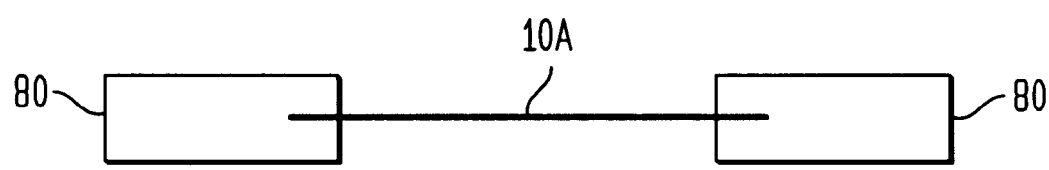
FIGS. 8(a) and 8(b) schematically illustrates circuit device interconnections by nanoscale connectors.
Figure 8B:
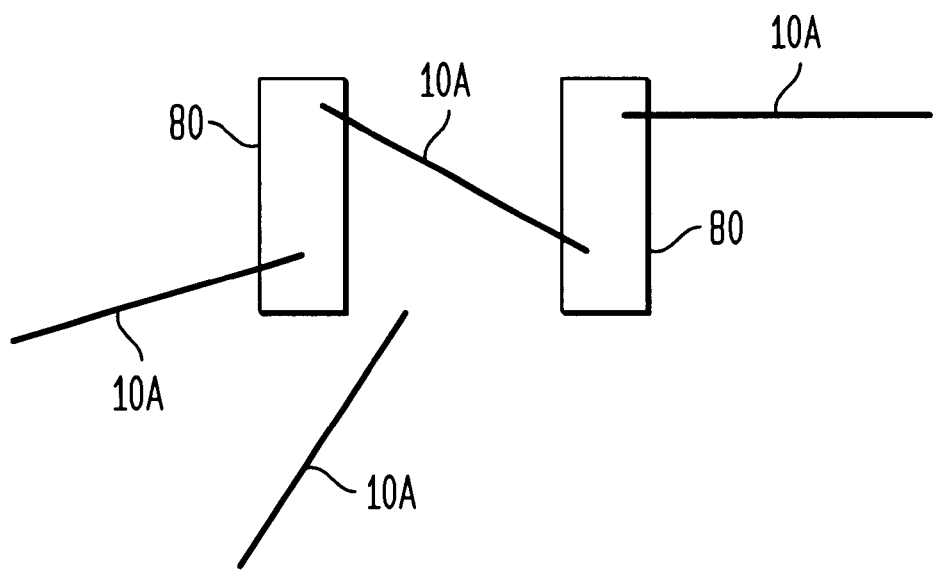

As shown in FIG. 8(*a*) the nanoconnectors 10A can be placed on circuit pads 80 by individual micro-manipulation or nano-manipulation under high resolution microscope. Alternatively, as shown in FIG. 8(*b*) the nanoconnectors 10A are placed by random dropping such as by sedimentation from a thin layer of solution. Because of the equal-length of the nanoconnectors without undesirably long nanoconnectors, unwanted electrical shorting is avoided. The nanoconnectors 10A are then dried and bonded onto the underlying pads 80, as by soldering. The pad surface can be pre-coated with a solder layer and heated together with the contacting nanoconnectors). The device surface can be washed then to remove non-bonded nanoconnectors, i.e. those in FIG. 8(*b*) which are sitting on the surface of the circuit device without touching any of the contact pads 80.

The sedimentation and the solder bonding process can be repeated until all the desired electrical interconnections between adjacent contact pads are obtained.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. The method of preparing free-standing, equal length nanoscale conductive connectors comprising the steps of:

providing a removable substrate;

growing aligned nanoconductors on the substrate;

equalizing the lengths of the nanoconductors grown on the substrate; and removing the substrate to leave free standing, equal length nanoconductors.

2. The method of claim 1 wherein the nanoconductors are conductive nanotubes or nanowires.

3. The method of claim 1 wherein the removable substrate is a soluble material and the substrate is removed by dissolving it.

4. The method of claim 1 wherein the removable substrate includes a nanoconductor growth nucleating film.

5. The method of claim 1 wherein the length of the nanoconductors is equalized by the steps of:

providing a substrate including attached nanoconductors;

burying portions of the attached nanoconductors with a sacrificial locking layer deposited to only a desired height level; and removing the unburied portions of the nanoconductors so that the remaining buried lengths are equalized.

6. The method of claim 5 wherein the sacrificial locking layer is a soluable material.

7. The method of claim 1 further comprising the step of functionalizing the nanoconductors by attaching organic molecular functionalities to them.

8. The method of claim 7 wherein the functionalized nanoconductors are soluble.

* * * * *